United States Patent
Yamamoto et al.

(10) Patent No.: US 7,129,017 B2
(45) Date of Patent: Oct. 31, 2006

(54) CHEMICALLY AMPLIFIED RESIST COMPOSITION AND METHOD FOR FORMING PATTERNED FILM USING SAME

(75) Inventors: Hajime Yamamoto, Kawasaki (JP); Kenichi Murakami, Aizuwakamatsu (JP); Satoshi Takechi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 11/098,396

(22) Filed: Apr. 5, 2005

(65) Prior Publication Data

US 2005/0175936 A1    Aug. 11, 2005

Related U.S. Application Data

(62) Division of application No. 09/940,665, filed on Aug. 29, 2001, now Pat. No. 6,902,859.

(30) Foreign Application Priority Data

Apr. 10, 2001    (JP)    ............................ 2001-111740

(51) Int. Cl.
    *G03F 7/004* (2006.01)
(52) U.S. Cl. .................................. 430/270.1; 430/905
(58) Field of Classification Search ...................... None
    See application file for complete search history.

(56) References Cited

U.S. PATENT DOCUMENTS

| | | | |
|---|---|---|---|
| 5,356,752 A | 10/1994 | Cabrera et al. | |
| 5,856,561 A | 1/1999 | Nagata et al. | |
| 5,929,176 A | 7/1999 | Kim et al. | |
| 6,291,130 B1 | 9/2001 | Kodama et al. | |
| 6,312,867 B1 | 11/2001 | Kinsho et al. | |
| 6,376,149 B1 | 4/2002 | Grober et al. | |
| 6,383,713 B1 | 5/2002 | Uetani et al. | |
| 6,537,726 B1 | 3/2003 | Nakanishi et al. | |
| 6,902,859 B1 * | 6/2005 | Yamamoto et al. | ...... 430/270.1 |
| 2003/0096189 A1 | 5/2003 | Yagihashi et al. | |

FOREIGN PATENT DOCUMENTS

| | | |
|---|---|---|
| DE | 4125258 | 2/1993 |
| DE | 19721693 | 6/1998 |
| EP | 0829766 | 3/1998 |
| EP | 0999474 | 5/2000 |
| EP | 1004568 | 5/2000 |
| EP | 1143300 | 10/2001 |
| JP | 06-051518 | 2/1994 |

* cited by examiner

*Primary Examiner*—Amanda Walke
(74) *Attorney, Agent, or Firm*—Westerman, Hattori, Daniels & Adrian, LLP

(57) ABSTRACT

A chemically amplified resist composition which comprises a base resin reacting in the presence of an acid, a photo acid generator generating an acid upon exposure, and a compound having the combination of an acetal moiety and a site which is eliminated by an acid in its molecule, or which comprises a base resin, which is a copolymer having the combination of an acetal moiety and a site eliminated by an acid in one repeating unit and reacts in the presence of an acid, and a photo acid generator generating an acid upon exposure.

16 Claims, 1 Drawing Sheet

CHEMICALLY AMPLIFIED RESIST COMPOSITION AND METHOD FOR FORMING PATTERNED FILM USING SAME

This application is a divisional application of prior application Ser. No. 09/940,665 filed Aug. 29, 2001 now U.S. Pat. No. 6,902,859.

CROSS-REFERENCE TO RELATED APPLICATION

This application is based upon and claims priority of Japanese Patent Application No. 2001-111740, filed on Apr. 10, 2001, the contents being incorporated herein by reference.

BACKGROUND OF THE INVENTION

1. Field of the Invention

The invention relates to a resist composition, which is a radiation-sensitive material used in the manufacture of semiconductor devices, and a method for forming a patterned film using the resist composition. As used herein, the radiations includes ultraviolet rays, vacuum ultraviolet rays, far-ultraviolet rays, X-rays, and electron beams.

2. Description of the Related Art

In the manufacture of semiconductor devices, such as semiconductor integrated circuits, the formation of fine patterns is indispensable. For the formation of a fine pattern on a semiconductor integrated circuit, the use of a lithography technique, in which a resist material is coated on a film provided on a substrate to be processed to thereby form a resist layer, the resist layer is then selectively exposed and developed to provide a resist pattern, the resultant resist pattern is used as a mask to dry-etch the underlying film to thereby transfer the pattern of the resist to the film, and the resist layer is then removed to leave the film having a desired pattern on the substrate, is required.

As a radiation used for the exposure of a resist layer, ultraviolet rays were initially used and, in the course of time, far-ultraviolet rays or X-rays, which have a shorter wavelength, or electron beams, have been used due to the miniaturization of the patterns to be formed. Following a change in the radiation used, a resist material, which has good resolution, high sensitivity, and excellent dry-etching resistance, corresponding to the radiation, is required. Particularly with exposure using an excimer laser beam, high energy-exposure is inevitable in order to increase the sensitivity of a resist material while retaining its resolution, due to the absorption by a benzene ring which is contained in conventional resist materials, and there have been problems, such as decreased durability of a lens made of quartz or the like used in a radiation source apparatus and the necessity of a high laser power. On the other hand, with electron beam-exposure, which inherently has a low throughput, improvement of throughput cannot be obtained unless a resist material having a high sensitivity is used.

Accordingly, different resist materials are offered corresponding to the wavelength of the light used for exposure. As one type of these materials, various chemically amplified resist materials are provided. In principle, a chemically amplified resist is a composition comprising an acid-sensitive material and an acid generator. By the use of such a composition, a resist mask having a predetermined pattern can be formed by exposing the composition to generate an acid from the acid generator under the action of light or radiation, and then-reacting an acid-sensitive material using the generated acid as a catalyst by post exposure bake (post bake), to thereby cause a change in solubility of the composition in a developer. With the chemically amplified resist materials, it has been a problem to provide them with a high sensitivity without altering other properties such as resolution. This is explained hereinafter with reference to, by way of example, a chemically amplified resist used for exposure by an ArF excimer laser beam.

For instance, a resist composition using an alkaline-soluble hydrogen-added phenol resin having some of the hydroxyl groups thereof substituted with groups which are unstable in an acid is proposed in JP-A-6-51518 (Zeon Corporation). This publication provides a chemically amplified resist having balanced properties of sensitivity, resolution, etching resistance, storage stability and others by the use of the hydrogen-added phenol resin as a base resin, but does not disclose a technique for rendering the chemically amplified resist more sensitive to exposing radiation.

It is known that a resist composition using a copolymer of two methacrylic monomers, 2-methyladamantyl methacrylate and gamma-butyrolactone methacrylate, as a base resin, and also using a photo acid generator based on an onium salt of sulfonic acid and an aniline-based quencher, is a chemically amplified resist material provided with good resolution and practical dry-etching resistance. The copolymer, as the base resin in this resist material, is represented by the general formula:

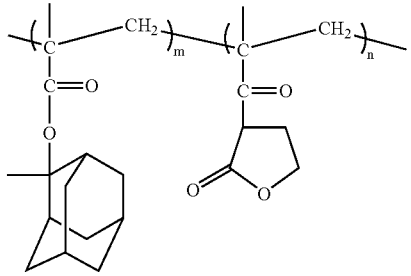

the copolymer incorporating 2-methyladamantyl group in place of a benzene ring, which is contained in a base resin used in a conventional resist material for ArF excimer laser beam exposure, and strongly absorbing radiation at wavelength of the ArF excimer laser beam. Such a resist material using the copolymer of two methacrylic monomers has a sensitivity of the order of 10 to 20 mJ/cm² at conditions retaining a practical resolution, although the sensitivity depends on the process conditions used. In general, in order to ensure a practical lens life in the case of the use of an ArF excimer laser beam, it is required that a resist material can be resolved at a sensitivity of 10 mJ/cm² or lower. The base resin in the above resist material, however, cannot have a higher sensitivity because of the use of an ester group containing a quaternary carbon, which has a high activation energy, as a group reacting upon exposure.

On the other hand, a reacting group of quaternary carbon-containing ester can provide a resist material superior in resolution, because it greatly changes its polarity before and after a reaction, and can easily yield a high contrast upon the dissolution of the material in a developer. For this reason, the quaternary carbon-containing ester group is used as a reacting group not only in resists for ArF excimer laser beam exposure but also various resists for KrF excimer laser beam, F₂ laser beam, extreme ultraviolet (EUV) radiation, and electron beam exposure. However, it is also difficult for these resist materials to have both a good resolution and a high sensitivity, as the resist materials for ArF excimer laser beam exposure do.

SUMMARY OF THE INVENTION

It is an object of the invention to provide a chemically amplified resist composition of a type that changes its solubility, under the effect of an acid generated at the exposure to a radiation, in a developer at portions exposed to the radiation, the composition having a high reactivity to an acid generated at exposure so that elimination of a protective group on an acid-sensitive material readily progresses, and has an improved sensitivity compared to conventional compositions of similar type.

It is also an object of the invention to provide a method for forming a patterned film using the chemically amplified resist composition according to the invention.

In the invention, to solve the above problems, a compound having, in combination, an acetal moiety and a site which is eliminated by an acid, in its molecule (the same skeleton), is used. Preferably, this compound has the acetal moiety and the site eliminated by an acid at locations such that a ring structure can be eventually created through reactions in the presence of the acid. The compound may be added to the chemically amplified resist composition as an additive. Alternatively, a polymeric resin (base resin) itself constituting the chemically amplified resist composition may be such a compound; in this case, the acetal moiety and the site eliminated by an acid are present in one repeating unit of the base resin.

Thus, in one aspect, the chemically amplified resist composition of the invention is a composition comprising a base resin reacting in the presence of an acid, a photo acid generator generating an acid upon exposure, and a compound having the combination of an acetal moiety and a site which is eliminated by an acid in its molecule.

In another aspect, the chemically amplified resist composition of the invention is a composition comprising a base resin, which is a copolymer having the combination of an acetal moiety and a site eliminated by an acid in one repeating unit and reacts in the presence of an acid, and a photo acid generator generating an acid upon exposure.

In either of the cases of using a chemically amplified resist composition containing, as an additive, the compound as delineated above, and using a chemically amplified resist composition containing, as a base resin, the compound as also delineated above, a resist pattern can be formed on a film provided on the surface of a substrate, by applying the chemically amplified resist composition to the film on the substrate, to form a resist layer, pre-baking the resist layer, selectively exposing the pre-baked resist layer to a radiation, post-baking the exposed resist layer, and then developing the post-baked resist layer, and using the developed resist pattern as a mask, the underlying film can be patterned.

DETAILED DESCRIPTION OF THE INVENTION

Figure 1A:
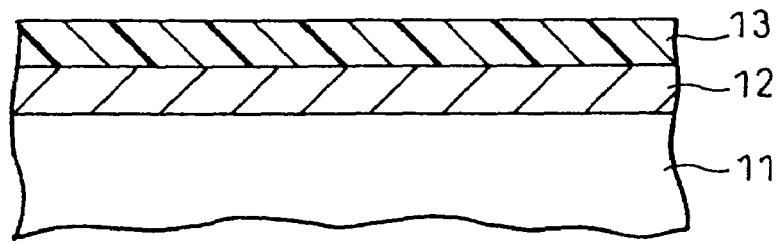
FIGS. 1A to 1D illustrate a process for forming a patterned film on a substrate using the chemically amplified resist composition of the invention.

In the invention, a compound having, in combination, an acetal moiety and a site which is eliminated by an acid, in its molecule (the same skeleton), is used. As an example of such a compound, a compound which is represented by the formula:

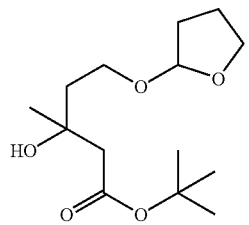

can be referred to. The compound has, in its molecule, an acetal moiety and a site of carboxylate provided with a leaving group which is eliminated by an acid. The acetal moiety of the compound exemplified here undergoes an elimination reaction at normal temperature in the presence of an acid generated from a photo acid generator in a chemically amplified resist composition upon exposure, to thereby generate a further acid. By increasing the temperature, the substituent (leaving group) on the cite of ester of carboxylic acid leaves the site and, accordingly, an acid is also generated from this site. Thus, a sequence of reactions of the above compound in the presence of an acid progress as shown in the following reaction formula, and finally produce a product having a ring structure:

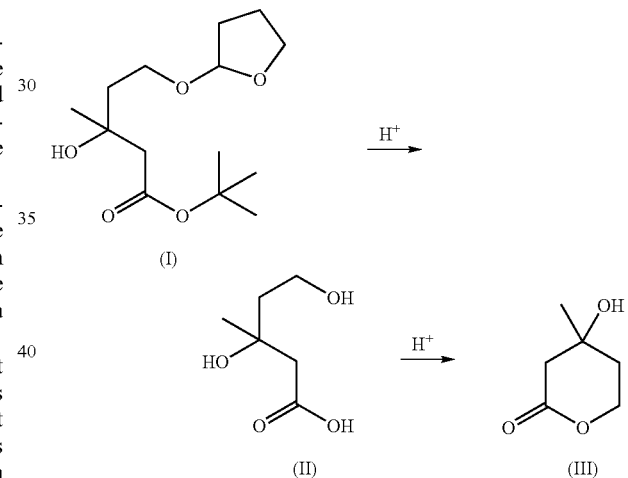

In the sequence of reactions, the compound of formula (II) having a hydroxyl group and a carboxyl group in its molecule, which is produced by the elimination of the acetal moiety and the elimination of the substituent on the site of carboxylate of the compound of formula (I), readily has a ring formation reaction in the molecule because of low activation energies of both groups, and the product of ring structure shown by formula (III) is finally produced. In this way, the sequence of reactions of acid-destruction and ring formation smoothly progress in the presence of acid. The final product having a ring structure and remaining in a resist composition after the exposure is easy to dissolve in an developer represented by, for example, an aqueous solution of tetramethylammonium hydroxide ((TMAH)aq.). Consequently, and particularly in the case of positive resist compositions, the resist composition after the exposure is capable of being developed by a smaller amount of developer, which is useful for the improvement of sensitivity of the resist composition.

Although the compound described above has the acetal moiety and the site which is eliminated by an acid at the respective ends of the molecule, it is permissible that one or both of the acetal moiety and the site which is eliminated by an acid are not present at the ends of the molecule. In this case, it is preferred that the acetal moiety and the site which is eliminated by an acid are at locations such that a final product can have a ring structure by reactions in the presence of the generated acid. This also applies to the case where a copolymer having, in one repeating unit, the acetal moiety and the site which is eliminated by an acid is used as a base resin. Also, in this case, it is preferred that both acetal moiety and site which is eliminated by an acid are at locations such that a final product can have a ring structure by reactions in the presence of the generated acid. By the fact that the final product produced through the sequence of reactions of the compound in the presence of the generated acid has a ring structure, it can be expected that the chemically amplified resist composition of the invention has a higher sensitivity compared to a chemically amplified resist composition using a polymer having a structure incorporating an acetal moiety alone as described, for example, in JP-A-6-51518. It is also preferred that the composition used in the invention has a structure which stereostructually displays a high reactivity.

As an example of compounds which have the acetal moiety at the middle of a molecular backbone and the site which is eliminated by an acid at the end of the molecule, a compound represented by the following formula can be referred to:

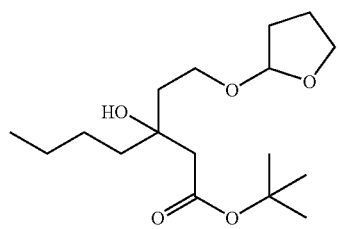

(2)

The compound of this formula can finally produce a product with a ring structure in the presence of an acid generated from an acid generator, like the earlier described compound having the acetal moiety and the site which is eliminated by an acid at the ends of the molecule, as follows:

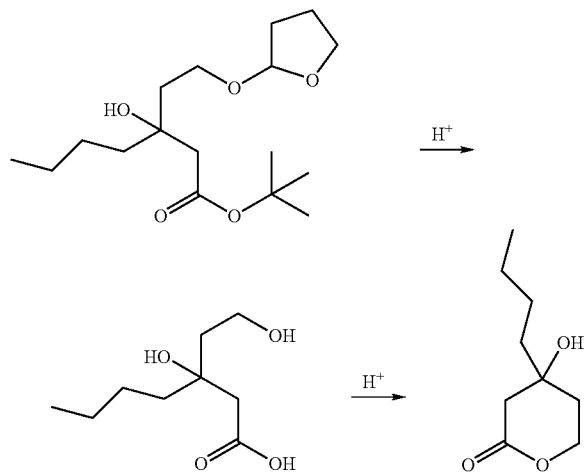

In the invention, a base resin itself constituting the chemically amplified resist composition may be the compound having the combination of the acetal moiety and the site which is eliminated by an acid. In this case, the acetal moiety and the site which is eliminated by an acid are present in one repeating unit of the base resin. As an example of resins having the acetal moiety and the site which is eliminated by an acid in one repeating unit, a copolymer represented by the formula:

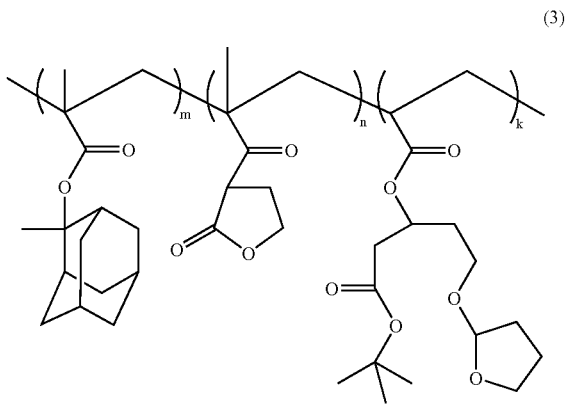

(3)

can be referred to, wherein m, n, and k are positive integers. The copolymer can be obtained by copolymerizing a compound (monomer) having the combination of the acetal moiety and the site which is eliminated by an acid in a molecule, as represented by the formula:

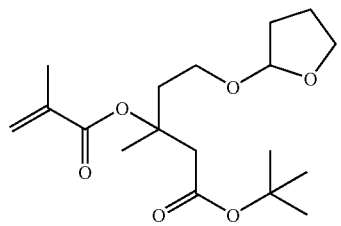

(4)

with 2-methyladamantyl methacrylate and gamma-butyrolactone methacrylate.

In the chemically amplified resist composition of the invention using, as an additive, a compound having the combination of the acetal moiety and the site which is eliminated by an acid in a molecule, the backbone of the base resin may be a homopolymer of an acrylate or methacrylate monomer or a copolymer of two or more of such monomers when importance is attached to a low cost and good lithographic properties, such as resolution, of the resist composition, or may be a cycloolefin polymer, such as a copolymer of norbornene and maleic anhydride, a hybrid polymer of an acrylate or methacrylate monomer and a cycloolefin monomer, or the like, when importance is attached to dry-etching resistance of a resist pattern formed of the resist composition.

Also in the chemically amplified resist composition comprising, as a base resin, a compound having, in one repeating unit, the combination of the acetal moiety and the site which is eliminated by an acid, the base resin may be, among others, a copolymer having, in addition to the repeating unit having the combination of the acetal moiety and the site which is eliminated by an acid, a repeating unit derived from an acrylate or methacrylate monomer, or a repeating unit based on a cycloolefin monomer, such as a copolymer of norbornene and maleic anhydride, or a combination of repeating units derived from an acrylate or methacrylate monomer and a cycloolefin monomer.

Regarding the choice of the base resin, a type of exposing radiation should be also considered. For example, when an ArF laser beam is used for the exposure, a polymer which can be used as the base resin may be exemplified by, among others, a copolymer of 2-methyladamantyl methacrylate and gamma-butyrolactone methacrylate, or a copolymer having a skeleton of the formula:

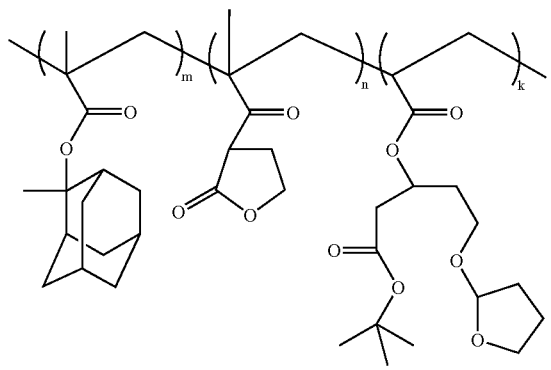

wherein m, n, and k are positive integers.

In the case of the use of an $F_2$ laser beam, the base resin may be exemplified by a copolymer having the formula:

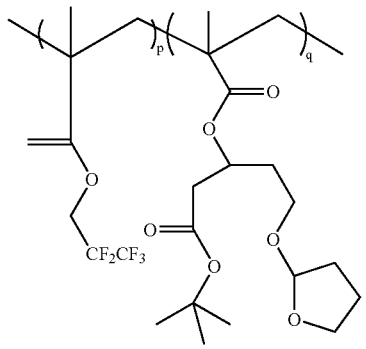

wherein p and q are positive integers, which is a copolymer of a monomer of the formula:

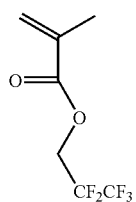

(5)

and the compound of formula (4), which is indicated above.

In the case of the use of a KrF laser beam, the base resin may be exemplified by a copolymer comprising a repeating unit derived form the compound of formula (4), which is indicated above, and represented by the formula:

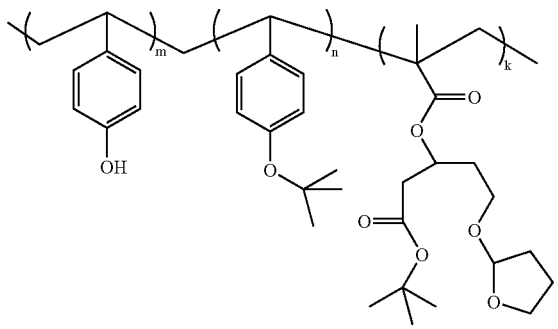

wherein m, n, and k are positive integers.

The base resin of the chemically amplified resist composition of the invention is not restricted to those referred to above, in the case where the composition contains a compound having the combination of the acetal moiety and the site which is eliminated by an acid as an additive, as well as in the case where it contains such a compound as a base resin.

As the photo acid generator in the chemically amplified resist composition of the invention, any of photo acid generators used in conventional chemically amplified resist compositions commonly known to persons skilled in the art may be used. It is also possible to use, in the chemically amplified resist composition of the invention, optional components also commonly known to persons skilled in the art, such as a quencher and the like.

The chemically amplified resist composition of the invention, which contains a compound having, in its molecule, a combination of the acetal moiety and the site which is eliminated by an acid, can have a high sensitivity, because reactions progress easily in the presence of an acid generated from a photo acid generator upon exposure, and acid is further generated with the progress of the reactions. In addition, since the composition has such an improved sensitivity, the composition also has an advantage of its sensitivity being controllable without damaging its lithographic properties.

Figure 1B:
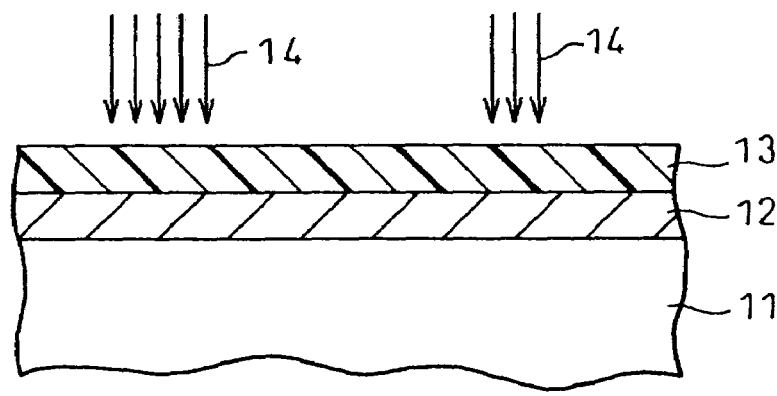
Figure 1C:
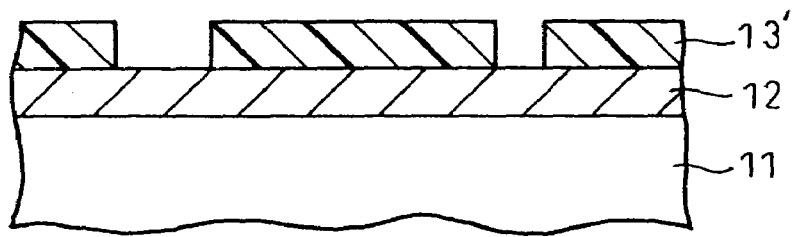
Figure 1D:
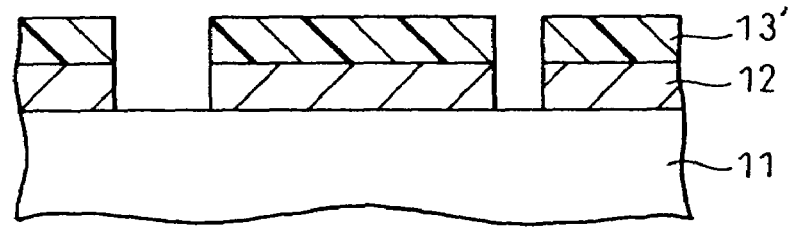

A process for forming a patterned film using the chemically amplified resist composition of the invention will now be described with reference to, by way of example, a resist of a positive type. As shown in FIG. 1A, a chemically amplified resist composition is applied to a film 12 to be patterned, which is previously provided on a substrate 11, to thereby form a resist layer 13. After pre-baking, the resist layer 13 is selectively exposed using a radiation 14 from an appropriate source (not shown), as shown in FIG. 1B. The resist layer 13 is then post-baked together with the substrate 11, and can be developed using an appropriate developer to form a certain resist pattern 13' as shown in FIG. 1C. Subsequently, using the resist pattern 13' as a mask, the underlying film 12 can be patterned so that the resist pattern is transferred to the underlying film 12 to provide it with a desired pattern, as shown in FIG. 1D. The resist pattern 13' can then be removed. A sequence of steps of from the application of the resist composition to the transfer of the resist pattern to the underlying film and the removal of the resist pattern in this process may be carried out using any known method.

EXAMPLES

The invention will be further described by the following examples. The invention is not limited to these examples, however.

Example 1

From two types of metacrylic monomers, 2-methyladamantyl metacrylate and gamma-butyrolactone methacrylate, a copolymer was prepared as described in JP-A-11-12326, the copolymer being represented by the formula:

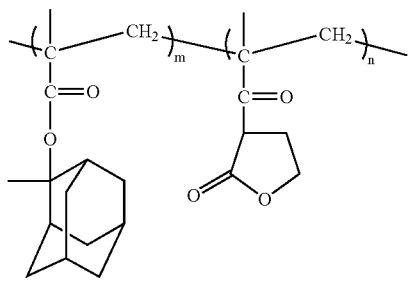

and having a weight average molecular weight of about 10,000 and an m/n ratio of 50:50. Using the copolymer as a base resin, a positive chemically amplified resist composition was prepared by mixing 100 parts by mass of copolymer, 3 parts by mass of photo acid generator based on an onium salt of sulfonic acid and 0.2 part by mass of aniline-based quencher, the photo acid generator and the quencher being represented by the following formula, respectively:

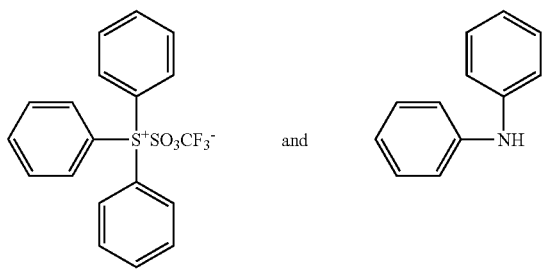

The composition thus prepared was then dissolved in 1000 parts by mass of solvent (propylene glycol monomethyl ether acetate (PGMEA)), and two resist solutions were prepared by adding, to the resultant mixture, a compound represented by the formula:

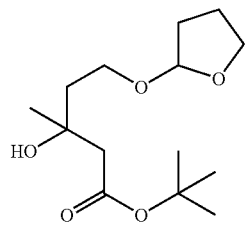

as an additive, in amounts of 5% by mass and 10% by mass, based on the mass of the resist composition, respectively.

Example 2

Each of the resist solutions prepared in Example 1 was applied to a silicon wafer substrate, and soft-baked at 115° C. for 60 seconds to form a film. The film was then irradiated with an ArF excimer laser beam in exposure energies stepwise increasing from 4 mJ/cm$^2$ at constant intervals of 0.2 mJ/cm$^2$, and was post-exposure baked at 115° C. for 60 seconds to form a resist film having a thickness of 0.4 micrometer. Subsequently, the resist film was developed using a developer of 2.38% TMAH. In consequence, the initial exposure energy of 4 mJ/cm$^2$ was already in excess, and the resist film could not be patterned. Accordingly, a resist solution was prepared again by changing the amount of additive to 1% by mass, and the same procedure was followed. In consequence, it was verified that a 1:1 line-and-space pattern of 130 nanometers could be formed at a high sensitivity of 10 mJ/cm$^2$ or more.

Example 3

Using, as a base resin, a polymeric resin represented by the formula:

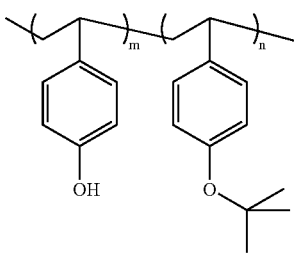

which was derived from a polyhydroxystyrene (PHS) commonly used in resists for KrF laser beam (wavelength: 248 nm) exposure by partially substituting hydroxyl with a leaving substituent, the resin having a weight average molecular weight of about 10,000 and an m/n ratio of 70:30, a positive chemically amplified resist solution was prepared by adding, to 100 parts by mass of base resin, the photo acid generator and the quencher used in Example 1, in amounts of 3 parts by mass and 0.2 part by mass, respectively, and further adding the compound used in Example 2, in an amount of 5% by mass. The resultant resist solution was used to carry out a process treatment similar to that described in Example 2 through the exposure using a KrF laser beam. In consequence, it was verified that a 1:1 line-and-space pattern of 130 nanometers could be formed at a high sensitivity of 20 mJ/cm$^2$ or less.

Example 4

The moiety derived from a compound represented by the formula:

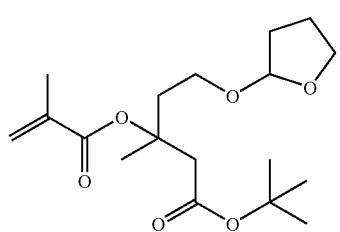

was incorporated in the backbone of the base resin used in Example 1 to obtain a polymer represented by the formula:

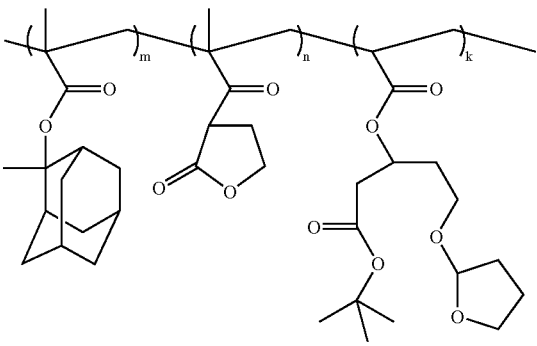

the polymer having a weight average molecular weight of 10,000 and an m/n/k ratio of 50:45:5.

Using this polymer as a base resin in this example, a chemically amplified resist composition was prepared by mixing 100 parts by mass of base resin with the photo acid generator based on an onium salt of sulfonic acid and the aniline-based quencher as used in Example 1, in amounts of 3 parts by mass and 0.2 part by mass, respectively. The resultant composition was then dissolved in 1000 parts by mass of solvent (propylene glycol monomethyl ether acetate (PGMEA)) to prepare a resist solution.

Example 5

Using the resist solution prepared in Example 4, experiments were run as described in Example 2. In consequence, it was verified that a 1:1 line-and-space pattern of 130 nanometers could be formed at a high sensitivity of 2 mJ/cm$^2$ or less.

Although all the resist compositions used in the above examples were of positive type, the invention is, of course, applicable also to negative types of resist compositions which are not different from positive types of resist compositions in that they have reactions which progress at exposed portions thereof under the effect of an acid generated from a photo acid generator by exposing the composition to a radiation.

The invention claimed is:

1. A chemically amplified resist composition comprising a base resin, which is a copolymer having the combination of an acetal moiety and a site eliminated by an acid in one repeating unit and reacts in the presence of an acid, and a photo acid generator generating an acid upon exposure.

2. The chemically amplified resist composition of claim 1, wherein said repeating unit has the acetal moiety and the site eliminated by an acid at locations such that a final product containing a ring structure can be produced through reactions in the presence of the acid.

3. The chemically amplified resist composition of claim 1, wherein said copolymer has, in addition to said repeating unit, a repeating unit derived from an acrylate or methacrylate monomer, or a repeating unit derived from a cycloolefin monomer, or a combination of repeating units derived from an acrylate or methacrylate monomer and a cycloolefin monomer.

4. The chemically amplified resist composition of claim 2, wherein said copolymer has, in addition to said repeating unit, a repeating unit derived from an acrylate or methacrylate monomer, or a repeating unit derived from a cycloolefin monomer, or a combination of repeating units derived from an acrylate or methacrylate monomer and a cycloolefin monomer.

5. The chemically amplified resist composition of claim 1, wherein said copolymer is represented by the formula:

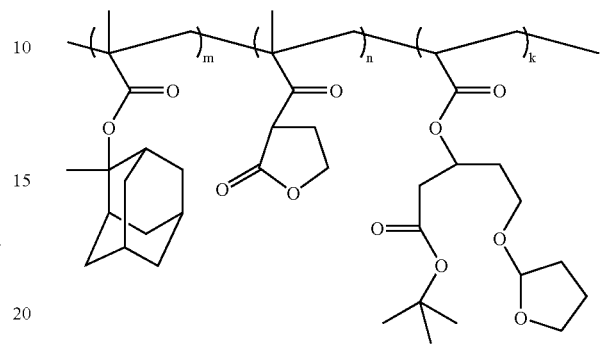

wherein m, n, and k are positive integers.

6. The chemically amplified resist composition of claim 2, wherein said copolymer is represented by the formula:

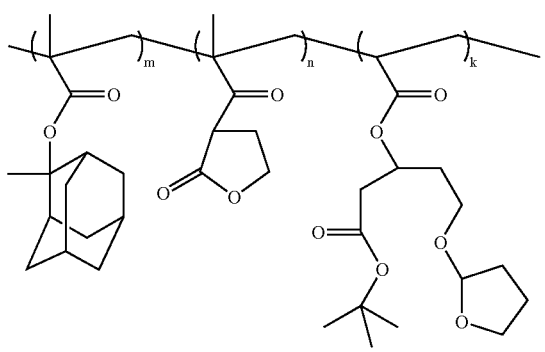

wherein m, n, and k are positive integers.

7. The chemically amplified resist composition of claim 1, wherein said copolymer is represented by the formula:

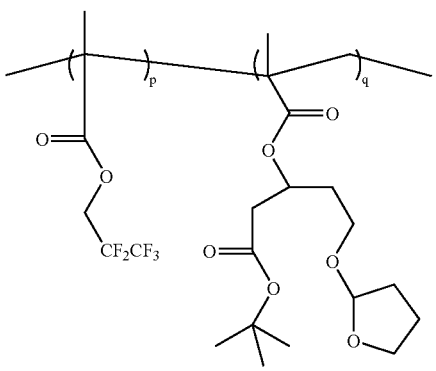

wherein p and q are positive integers.

8. The chemically amplified resist composition of claim 2, wherein said copolymer is represented by the formula:

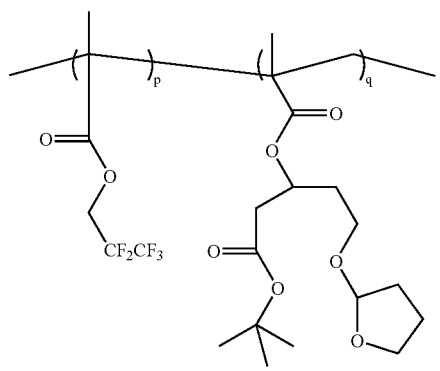

wherein p and q are positive integers.

9. The chemically amplified resist composition of claim 1, wherein said copolymer is represented by the formula:

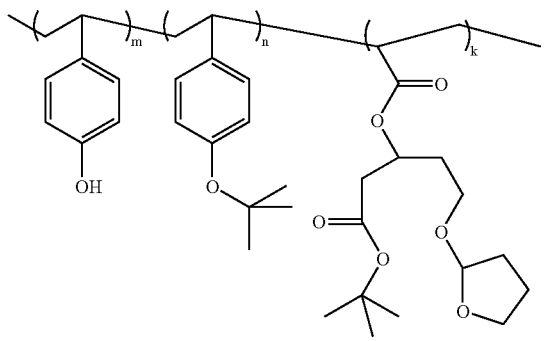

wherein m, n, and k are positive integers.

10. The chemically amplified resist composition of claim 2, wherein said copolymer is represented by the formula:

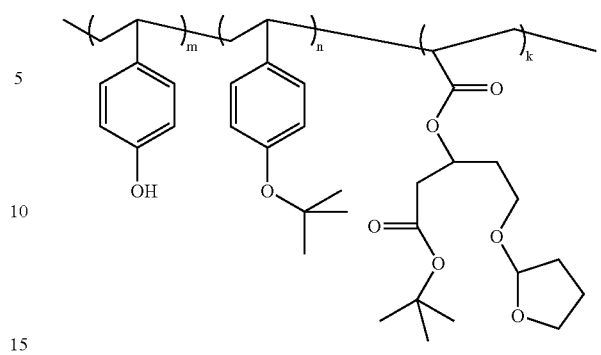

wherein m, n, and k are positive integers.

11. The chemically amplified resist composition of claim 1, wherein said copolymer is free of aromatic rings.

12. The chemically amplified resist composition of claim 2, wherein said copolymer is free of aromatic rings.

13. A method for forming a patterned film by applying a resist material to a film provided on the surface of a substrate, to form a resist layer, pre-baking the resist layer, selectively exposing the pre-baked resist layer to a radiation, post-baking the exposed resist layer, developing the post-baked resist layer to form a resist pattern, and patterning the film underlying the resist pattern by the use of the resist pattern as a mask, wherein the chemically amplified resist composition of claim 8 is used as the resist material.

14. The method of claim 13, wherein said radiation is an excimer laser beam, X-rays, or an electron beam.

15. The method of claim 13, wherein said radiation is an ArF excimer laser beam or vacuum ultraviolet light having a shorter wavelength.

16. A chemically amplified resist composition comprising a base resin reacting in the presence of an acid, a photo acid generator generating an acid upon exposure, wherein the base resin has a repeating unit having the combination of an acetal moiety and a site which is eliminated by an acid.

* * * * *